United States Patent
Lee et al.

(10) Patent No.: US 10,642,305 B2
(45) Date of Patent: May 5, 2020

(54) HIGH-ACCURACY CMOS TEMPERATURE SENSOR AND OPERATING METHOD

(71) Applicant: SAMSUNG ELECTRONICS CO., LTD., Suwon-si, Gyeonggi-Do (KR)

(72) Inventors: Joo Sung Lee, Seoul (KR); Joo Seong Kim, Seoul (KR); Kwang Ho Kim, Yongin-si (KR); Sang Ho Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/294,704

(22) Filed: Mar. 6, 2019

(65) Prior Publication Data
US 2019/0278316 A1 Sep. 12, 2019

(30) Foreign Application Priority Data

Mar. 8, 2018 (KR) .................. 10-2018-0027317

(51) Int. Cl.
*G05F 3/26* (2006.01)
*H03M 1/46* (2006.01)
*G01K 7/01* (2006.01)

(52) U.S. Cl.
CPC .............. *G05F 3/265* (2013.01); *G01K 7/01* (2013.01); *H03M 1/46* (2013.01); *G05F 3/26* (2013.01); *G05F 3/267* (2013.01)

(58) Field of Classification Search
CPC .................................. G05F 3/26; G05F 3/267
USPC .......................... 323/281, 313–317; 327/539
See application file for complete search history.

(56) References Cited

U.S. PATENT DOCUMENTS

| 7,309,157 B1 | 12/2007 | Aslan et al. |
| 7,565,258 B2 | 7/2009 | Duarte |
| 7,821,320 B2 | 10/2010 | Ueda |
| 8,092,083 B2 | 1/2012 | Venkataraman et al. |
| 8,915,646 B2 | 12/2014 | Wei et al. |
| 9,587,994 B2 | 3/2017 | Yayama |
| 9,703,306 B2 | 7/2017 | Day et al. |
| 9,909,931 B2 | 3/2018 | Park et al. |
| 2008/0136504 A1* | 6/2008 | Kim .................. G05F 3/30 327/539 |
| 2009/0128230 A1* | 5/2009 | Roh .................. G05F 3/30 327/539 |
| 2010/0164608 A1* | 7/2010 | Shin .................. G05F 3/30 327/539 |

(Continued)

FOREIGN PATENT DOCUMENTS

KR 20160062491 A 6/2016

*Primary Examiner* — Gary A Nash
(74) *Attorney, Agent, or Firm* — Volentine, Whitt & Francos, PLLC (57) ABSTRACT

A CMOS temperature sensor is provided. The CMOS temperature sensor, comprises: a bandgap reference circuit outputting a constant bandgap reference voltage regardless of temperature using a first voltage inversely proportional to temperature and a second voltage proportional to temperature and generating a first current proportional to temperature using the second voltage; a reference voltage generator copying the first current and outputting a reference voltage generated using the first voltage and the copied first current; and a temperature information voltage generator copying the first current and outputting a temperature information voltage proportional to temperature.

20 Claims, 12 Drawing Sheets

(56) References Cited

U.S. PATENT DOCUMENTS

| | | | | |
|---|---|---|---|---|
| 2014/0266138 A1* | 9/2014 | Siao | ............ | G05F 3/16 323/313 |
| 2015/0227158 A1* | 8/2015 | Sako | ............ | G05F 1/561 323/313 |

\* cited by examiner

HIGH-ACCURACY CMOS TEMPERATURE SENSOR AND OPERATING METHOD

This application claims priority from Korean Patent Application No. 10-2018-0027317 filed on Mar. 8, 2018, the disclosure of which is hereby incorporated by reference in its entirety.

BACKGROUND

1. Field of the Invention

The present inventive concept relates to high-accuracy CMOS temperature sensors and related methods of operation.

2. Description of the Related Art

The performance of respective semiconductor circuits, components and/or elements may be materially affected by heat resulting from the operation of the semiconductor or its constituent elements. Therefore, in order to ensure acceptable performance of semiconductor circuits, components and elements, an accurate indication of heat generated by the semiconductor device is necessary.

Complementary metal oxide semiconductor (CMOS) temperature sensors are widely used to measure the temperature of a semiconductor device and/or its constituent components and elements. However, the accuracy of CMOS temperature sensors may vary according to process variation (s) associated with the fabrication of the elements included in the CMOS sensor.

SUMMARY

An aspect of the present inventive concepts is to provide a high-accuracy CMOS temperature sensor that can secure accuracy.

Another aspect of the present inventive concepts is to provide a method of operating a high-accuracy CMOS temperature sensor capable of securing accuracy.

According to some aspects of the inventive concept, a CMOS temperature sensor includes; a bandgap reference circuit providing a bandgap reference voltage regardless of temperature using a first voltage inversely proportional to temperature and a second voltage proportional to temperature, and further providing a first current proportional to temperature using the second voltage, a reference voltage generator copying the first current and providing a reference voltage generated using the first voltage and the copied first current, and a temperature information voltage generator copying the first current and providing a temperature information voltage proportional to temperature.

According to some aspects of the inventive concept, a CMOS temperature sensor includes; a bandgap reference circuit providing a bandgap reference voltage regardless of temperature in relation to a first voltage inversely proportional to temperature and a second voltage proportional to temperature, a reference voltage generator providing a reference voltage generated by correcting the first voltage into the second voltage, and a temperature information voltage generator generating a temperature information voltage proportional to temperature on the basis of the second voltage.

According to some aspects of the inventive concept, a CMOS temperature sensor includes; a bandgap reference circuit including a first BJT and a second BJT whose base terminals are connected to each other, the bandgap reference circuit generating a temperature-proportional current using a first voltage, which is a base-emitter voltage of the first BJT, and a second voltage based on a difference between the first voltage and a base-emitter voltage of the second BJT; a reference voltage generator generating a reference voltage on the basis of the temperature-proportional current and the first voltage; and a temperature information voltage generator generating a temperature information voltage on the basis of the temperature-proportional current, and including a current source controlling an level of the temperature information voltage on the basis of the reference voltage.

However, aspects of the present inventive concepts are not restricted to those set forth above. The above and other aspects of the present inventive concept will become more apparent to one of ordinary skill in the art to which the present inventive concepts pertains by referencing the detailed description proved hereafter.

BRIEF DESCRIPTION OF THE DRAWINGS

The above and other aspects and features of the present inventive concepts will become more apparent by describing in detail exemplary embodiments thereof with reference to the attached drawings, in which.

DETAILED DESCRIPTION

Hereinafter, embodiments of the present inventive concept will be described with reference to the attached drawings.

Figure 1:
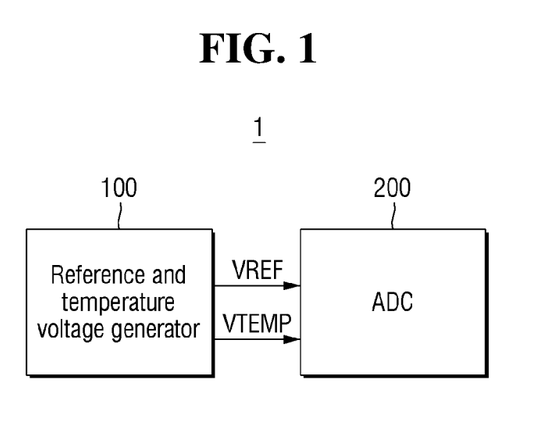
FIG. 1 is a block diagram illustrating of a CMOS temperature sensor according to embodiments of the inventive concept.

FIG. 1 is a block diagram illustrating a CMOS temperature sensor 1 according to embodiments of the inventive concept.

Referring to FIG. 1, the CMOS temperature sensor 1 generally includes a reference and temperature voltage generator 100 connected to an analog-digital converter (ADC) 200. Here, the reference and temperature voltage generator 100 may be used to generate a reference voltage VREF as well as a temperature information voltage VTEMP and provide same to the ADC 200. Each of the reference voltage VREF and the temperature information voltage VTEMP is an analog signal having a variable amplitude.

The ADC 200 may be used to generate digital temperature information DTEMP in response to the reference voltage VREF and the temperature information voltage VTEMP. That is, the ADC 200 may convert the analog temperature information voltage VTEMP into a digital equivalent (i.e., the digital temperature information DTEMP) using the reference voltage VREF. In certain embodiments the ADC 200 may be implemented as a successive approximation register ADC (or SAR ADC).

Figure 2:
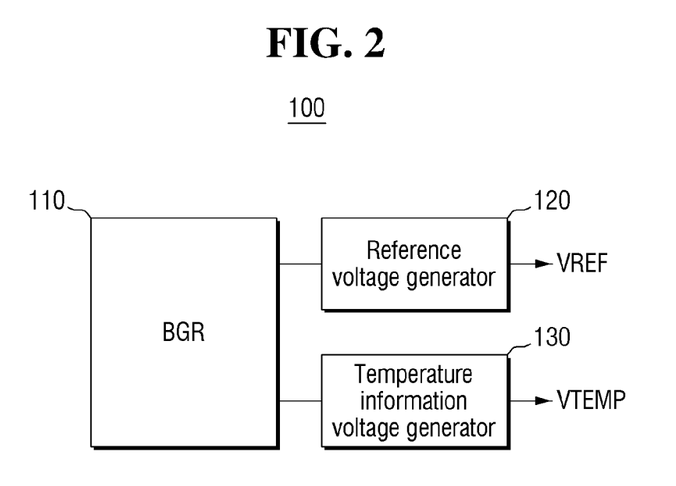
FIG. 2 is a block diagram further illustrating the reference and temperature voltage generator 100 of the temperature sensor of FIG. 1.

FIG. 2 is a block diagram further illustrating in one embodiment the reference and temperature voltage generator 100 of FIG. 1. Here, the reference and temperature voltage generator 100 may include a bandgap reference (BGR) circuit 110, a reference voltage generator 120, and a temperature information voltage generator 130.

The BGR circuit 110 may be used to provide a stable reference voltage or reference current that is minimally influenced by fluctuations in a power supply voltage, temperature variations and/or process variations. In certain embodiments the BGR circuit 110 may accomplish this voltage or current stability by relying on output characteristics in which a negative (−) temperature coefficient and a positive (+) temperature coefficient are offset one with another. The BGR circuit 110 may generate a bandgap reference voltage VBGR and/or a temperature-proportional current IPTAT, wherein the bandgap reference voltage VBGR corresponds to a reference voltage supplied by the bandgap reference circuit 110. The bandgap reference voltage VBGR may be generated based on a base-emitter voltage of a bipolar junction transistor (BJT) included in the bandgap reference circuit 110. The bandgap reference voltage VBGR should have a stable output, regardless of variations in a selected temperature of the semiconductor device.

The reference voltage generator 120 may be used to generate the reference voltage VREF in response to a reference voltage provided by the bandgap reference circuit 110. For example, the reference voltage generator 120 may generate the reference voltage VREF in response to a base-emitter voltage provided by a BJT included in the bandgap reference circuit 110.

In similar vein, the temperature information voltage generator 130 may generate a temperature information voltage VTEMP in response to a voltage provided by the bandgap reference circuit 110. For example, the temperature information voltage generator 130 may generate the temperature information voltage VTEMP in response to a base-emitter voltage of a BJT included in the bandgap reference circuit 110.

Figure 3:
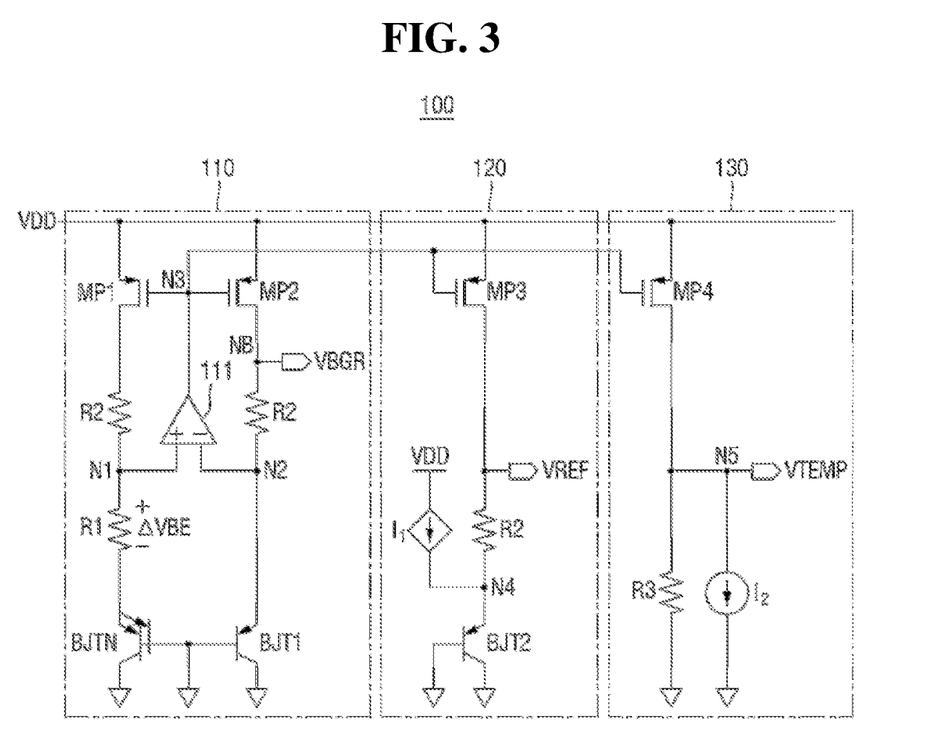
FIG. 3 is a circuit diagram further illustrating in one example the reference and temperature voltage generator 100 of FIG. 2.

FIG. 3 is a circuit diagram further illustrating in one embodiment the reference and temperature voltage generator 100 of FIGS. 1 and 2.

Referring to FIG. 3, the bandgap reference circuit 110 may include first and second PMOS transistors MP1 and MP2, an OPAMP 111, first and second resistors R1 and R2, and first and Nth BJTs (i.e., BJT1 and BJTN). Here, the first PMOS transistor MP1 and the second resistor R2 are connected in series between the first power supply voltage VDD and a first node N1, and the second PMOS transistor MP2 and the second resistor R2 are connected in series between the first power supply voltage VDD and a second node N2. The gate terminal of the first PMOS transistor MP1 and the gate terminal of the second PMOS transistor MP2 may be connected to a third node N3.

The first PMOS transistor MP1 and the second PMOS transistor MP2 may be transistors of same size. In this context, the relative size of a transistor may be determined by the width (W) to length (L) ratio of its channel region. Accordingly, in certain embodiments of the inventive concept, the W/L ratio of the first PMOS transistor MP1 and the second PMOS transistor MP2 will be the same. Therefore, assuming first and second transistors of same size, as well as voltages of same level being applied to their respective gates, sources and drains, an identical current of same level should flow through each one of the first and second transistors. In this context, the term "identical" is used in a practical or reasonably obtainable sense, not in the sense of a perfect ideal.

With this configuration, the bandgap reference circuit 110 outputs a voltage at node NB between the second PMOS transistor MP2 and the second resistor R2 as the bandgap reference voltage VBGR.

The OPAMP 111 receives a voltage level at the first node N1 and a voltage level at the second node N2 as respective input signals. The output of the OPAMP 111 is provided to the third node N3 connected between the gates of the first PMOS transistor MP1 and the second PMOS transistor MP2.

The first resistor R1 and the Nth BJT (BJTN) are connected in series between the first node N1 and the second power supply voltage (e.g., a ground voltage VSS).

The voltage across the first resistor R1 and the parallel BJTs (e.g., BJT1 and BJTN) is indicated in FIG. 3 as ΔVBE. Thus, a voltage between an emitter of the first BJT (BJT1) and the first resistor R1 may be represented as VBE1 and a voltage between an emitter of the second BJT (BJTN) may be represented as VBEN. Using this assumed nomenclature in the context of FIG. 3, the value of ΔVBE may be understood as (ΔVBE=VBE1−VBEN), where ΔVBE has characteristics proportional to an absolute temperature (PTAT).

With continued reference to the embodiment illustrated in FIG. 3, the respective base terminals of the first BJT and the Nth BJT are commonly connected to the second power supply terminal. Further, the size of the Nth BJT (BJTN) may be, for example, N times the size of the first BJT (BJT1), where 'N' is a real number greater than 1. Alternatively, size of the Nth BJT (BJTN) may be the same as the size of the first BJT (BJT1).

Figure 4:
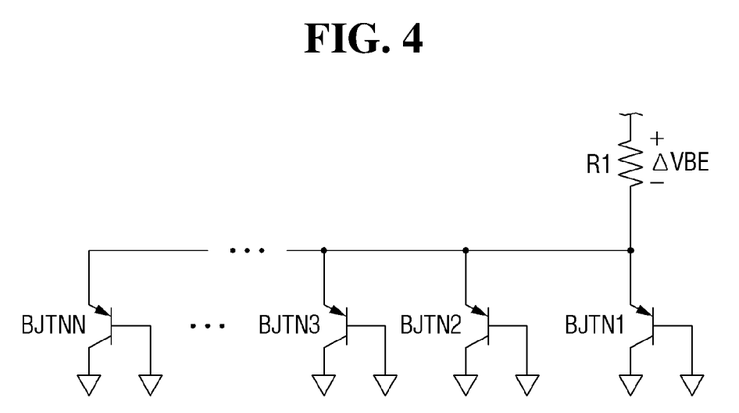
FIG. 4 is a circuit diagram further illustrating in one example a portion of the reference and temperature voltage generator 100 of FIG. 3.

FIG. 4 is a circuit diagram further illustrating in one example an aspect of the reference and temperature voltage generator 100 of FIG. 3, wherein a parallel arrangement of BJTs (e.g., BJTN1 through BJTNN) is provided between the first resistor R1 and the second power supply voltage.

Referring back to FIG. 3, the reference voltage generator 120 is operatively connected to the bandgap reference circuit 110. Specifically, the gate of a third PMOS transistor MP3 is connected to the third node N3 between the first and second PMOS transistors MP1 and MP2. The source of the third PMOS transistor MP3 is connected to the first power supply voltage VDD, and the drain of the third PMOS transistor MP3 is connected to the second resistor R2, such that the voltage level at the drain of the third PMOS transistor MP3 is provided as the reference voltage VREF.

The second resistor R2 of the reference voltage generator 120 is connected between the drain of the third PMOS transistor MP3 and a fourth node N4, and has the same resistive value as the second resistor R2 connected between the drain of the first transistor MP1 and the first node N1. A second BJT (BJT2) is connected between the fourth node N4 and the second power supply voltage, such that both the base and collector of the second BJT (BJT2) are connected to the second power supply voltage.

With this configuration, a first current source I1 connected to the fourth node N4 provides a controlled current through the second BJT (BJT2).

With continued reference to FIG. 3, the temperature information voltage generator 130 is operatively connected to the bandgap reference circuit 110 and the reference voltage generator 120. That is, the gate of a fourth PMOS transistor MP4 of the temperature information voltage generator 130 is also connected to the third node N3.

The source of the fourth PMOS transistor MP4 is connected to the first power supply voltage VDD, and the drain of the fourth PMOS transistor MP3 is connected to a third resistor R3, such that a voltage level at the drain of the fourth PMOS transistor MP4 is provided as the temperature information voltage VTEMP. Here, the third resistor R3 is connected between the a fifth node N5 (i.e., the drain of the fourth PMOS transistor MP4) and the second power supply voltage. A second current source I2 may be connected between the fifth node N5 and the second power supply voltage. In this manner, the second current source I2 may control a division of the current flowing through the fourth PMOS transistor MP4 from the third resistor R3. That is, the second current source I2 may be used to control the level of the temperature information voltage VTEMP in relation to a predetermined current level.

Figure 5:
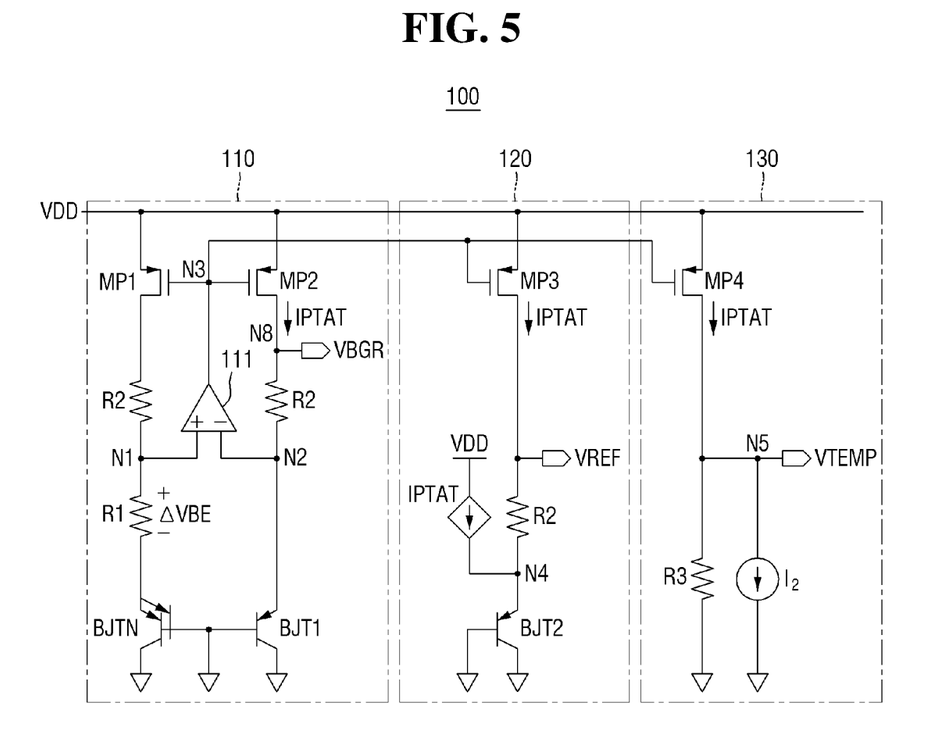
FIG. 5 is a circuit diagram further illustrating the operation of the CMOS temperature sensor according to embodiments of the inventive concept.

FIG. 5 is a circuit diagram further illustrating in one example the operation of the CMOS temperature sensor 100 of FIGS. 1, 2 and 3.

Referring to FIG. 5, the temperature-proportional current IPTAT is further illustrated flowing through current branches respectively associated with the combination of the first/second PMOS transistors MP1/MP2, the third PMOS transistor MP3, and the fourth PMOS transistor MP4.

Accordingly, in the bandgap reference circuit 110, the temperature-proportional current IPTAT flows from source to drain through the first PMOS transistor MP1 and the second PMOS transistor MP2. Assuming as before that the size of the first PMOS transistor MP1 is the same as the of the second PMOS transistor MP2, the temperature-proportional current IPTAT flows equally through the first PMOS transistor MP1 and the second PMOS transistor MP2.

Further, since the level of the temperature-proportional current IPTAT is equal to that of the current flowing through the first resistor R1, the level of the temperature-proportional current IPTAT may be determined according to $\Delta VBE$. Hence a relationship between the temperature-proportional current IPTAT and $\Delta VBE$ may be expressed as:

$$IPTAT = \Delta VBE / R1$$

As previously noted, the temperature-proportional current IPTAT has PTAT characteristics proportional to absolute temperature. That is, when the temperature of the first PMOS transistor MP1 or the second PMOS transistor MP2 increases, the level of the temperature-proportional current IPTAT also increases. And similar to the temperature-proportional current IPTAT, $\Delta VBE$ also has PTAT characteristics proportional to absolute temperature.

In the reference voltage generator 120, the temperature-proportional current IPTAT flows from source to drain of the third PMOS transistor MP3. The temperature-proportional current IPTAT may be combined with the current provided by the first current source I1 to the second BJT (BJT2).

Figure 6:
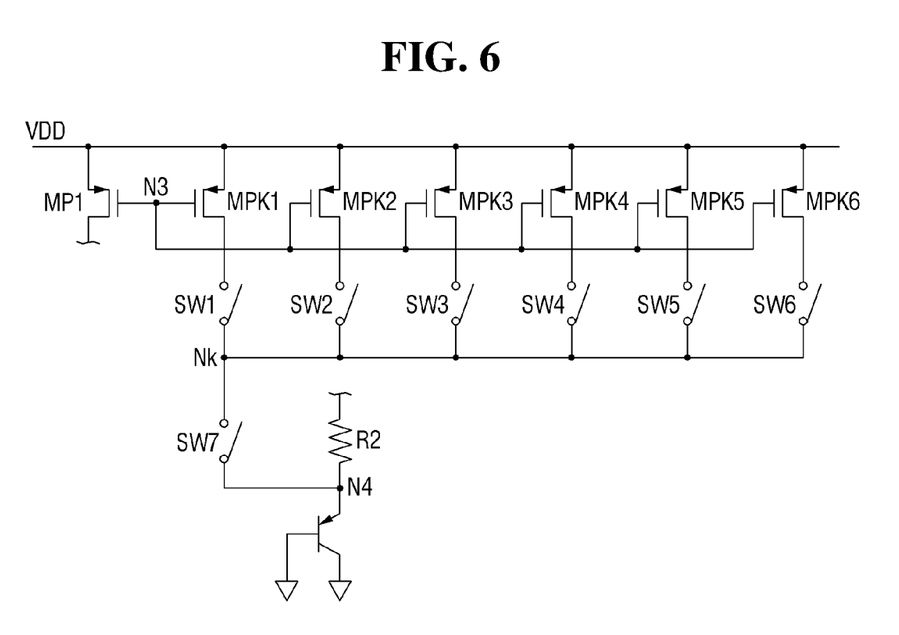
FIG. 6 is a circuit diagram further illustrating in one example the current source of FIG. 3.

One exemplary configuration for the first current source I1 of FIGS. 3 and 5 is shown in FIG. 6. Here, each gate of the PMOS transistors MPK1 to MPK6 is connected to the third node N3, each source is connected to the first power supply voltage VDD, and each drain is respectively connected to a corresponding first ends of switches SW1 through SW6. The second ends of switches SW1 through SW6 are commonly connected to a Kth node (Nk).

With this configuration, the first current source I1 may control the level (or intensity) of output current by controlling switched connection(s) for the plurality of PMOS transistors MPK1 to MPK6.

The plurality of PMOS transistors MPK1 to MPK6 may have various sizes. For example, MPK1 may have the same size (e.g., X) as one or more of the first, second and/or third PMOS transistors MP1, MP2, MP3. MPK2 may have a size X/2; MPK3 may have a (2X); MPK4 may have a size X/4; MPK5 may have a size 4X; and MPK6 may have a size X/8.

Continuing with these assumptions, it is further assumed that the first switch SW1 and the second switch SW2 are turned ON, while the third through sixth switches SW3 to SW6 are turned OFF. Under these conditions, MPK1 and MPK2 will be connected in parallel to effectively provide a transistor having a size 3/2X connected to the third node N3. Therefore, a current of 3/2 times that of the temperature-proportional current IPTAT may be provided to the fourth node N4 by the first current source I1.

As another example, assuming the second switch SW2 and the fourth switch SW4 are turned ON while the remaining switches SW1, SW3, SW5, and SW6 are turned OFF, a transistor having a size of 3/4X may be effectively connected to the third node N3. Therefore, a current of 3/4 times the level of the temperature-proportional current IPTAT may be provided to the fourth node N4 by the first current source I1.

The above-described circuit configurations for the first current source I1 are illustrative. Those skilled in the art will recognize that any reasonable number of transistors may be included in the first current source I1, variable transistor sizes may be realized, and therefore variable current levels may be obtained relative to the temperature-proportional current IPTAT.

Referring to back FIG. 5, in the temperature information voltage generator 130, the temperature-proportional current IPTAT flows from source to drain of the fourth PMOS transistor MP4. A part of the temperature-proportional current IPTAT provided from the fourth PMOS transistor MP4 to the fifth node N5 may flow to the second current source I2, and the remaining part provided to the third resistor R3.

In CMOS temperature sensors according to embodiments of the inventive concept, the temperature-proportional current IPTAT and base-emitter voltage of a selected BJT may be used to provide a stable reference voltage VREF.

Figure 7A:
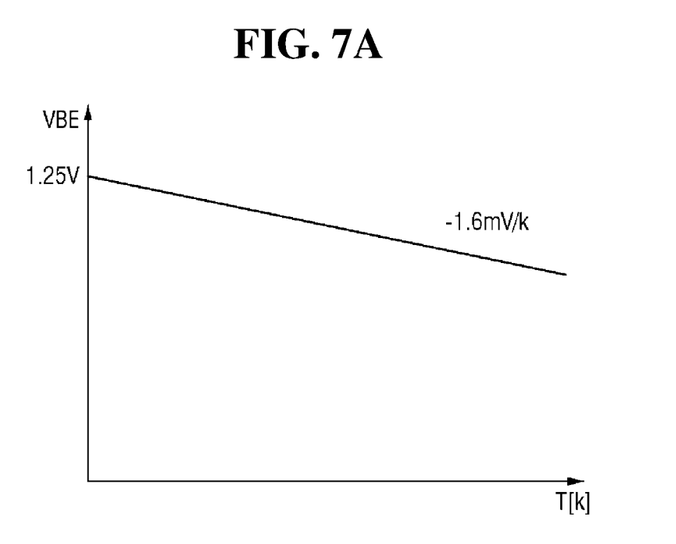
FIGS. 7A and 7B are graphs further illustrating the operation of the CMOS temperature sensor according to an embodiments of the inventive concept.
Figure 7B:
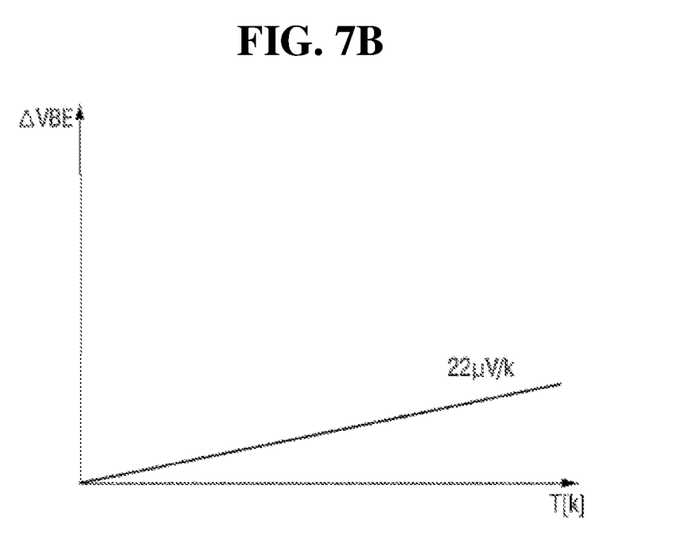

FIGS. 7A and 7B are graphs further illustrating operation of the CMOS temperature sensor 100 of FIGS. 1, 2, 3, and 5 according to embodiments of the inventive concept.

FIG. 7A illustrates a relationship between emitter-base voltage and absolute temperature. Here, the emitter-base voltage VBE in the BJT is a device-intrinsic characteristic, and is about 1.25 V at an absolute temperature of 0K. As the absolute temperature increases, the emitter-base voltage VBE may have a complementary to absolute temperature (CTAT) characteristic. That is, an inversely proportional relationship is established between the emitter-base voltage VBE and the absolute temperature. It is known that, when the absolute temperature increases by 1K, the emitter-base voltage VBE decreases by about −1.6 mV.

However, depending on the device-specific characteristics of the BJT, a phenomenon in which the emitter-base voltage VBE varies among a plurality of devices, that is, a variation is found. That is, the emitter-base voltage VBE may not be constant depending on the temperature change due to deterioration of the amplification performance of the BJT.

When the emitter-base voltage VBE varies, it is observed that the emitter base voltage VBE is 1.25 V at an absolute temperature 0K, that is, at the origin of the graph of FIG. 7A. However, at room temperature, for example, at a temperature 300K, the emitter-base voltage VBE may not coincide with a voltage curve due to the variation. In order to prevent the variation of the emitter-base voltage VBE, the emitter-base voltage VBE may be corrected using the characteristic values represented by other circuit components. The corrected emitter-base voltage VBE may be used to generate the reference voltage VREF.

FIG. 7B illustrates a relationship between ΔVBE and absolute temperature. As described above, since ΔVBE has PTAT characteristics, ΔVBE also increases when absolute temperature increases. It is known that, when the absolute temperature increases by 1K, the emitter-base voltage VBE decreases by about 22 μV.

Further, ΔVBE has a characteristic proportional to the absolute temperature regardless of the process variation affecting the performance of the BJT. In any case, ΔVBE increases at a rate of 22 μV/K when the absolute temperature increases by 1K.

The CMOS temperature sensor according to embodiments of the inventive concept may generate the reference voltage VREF by correcting the VBE having the CTAT characteristics using the ΔVBE having the PTAT characteristics.

Figure 8A:
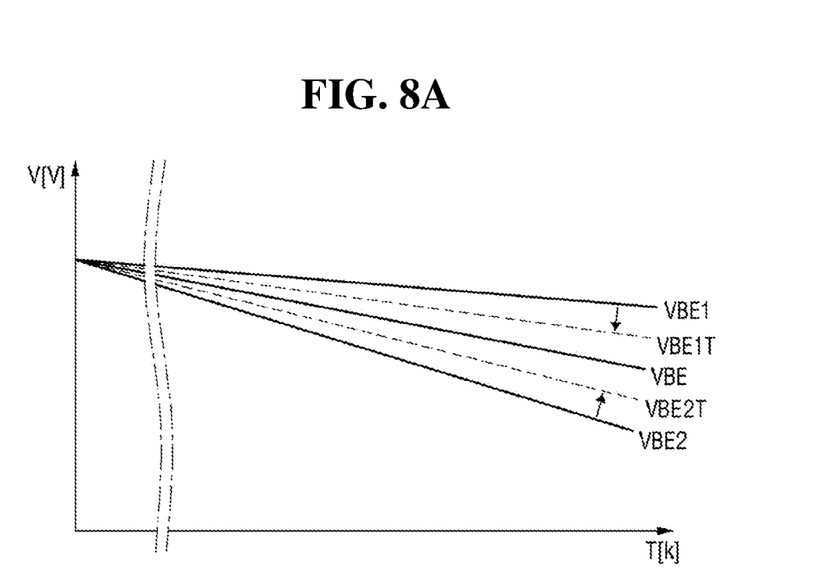
FIGS. 8A and 8B are graphs further illustrating the voltage correction performed by the CMOS temperature sensor according to embodiments of the inventive concept.
Figure 8B:
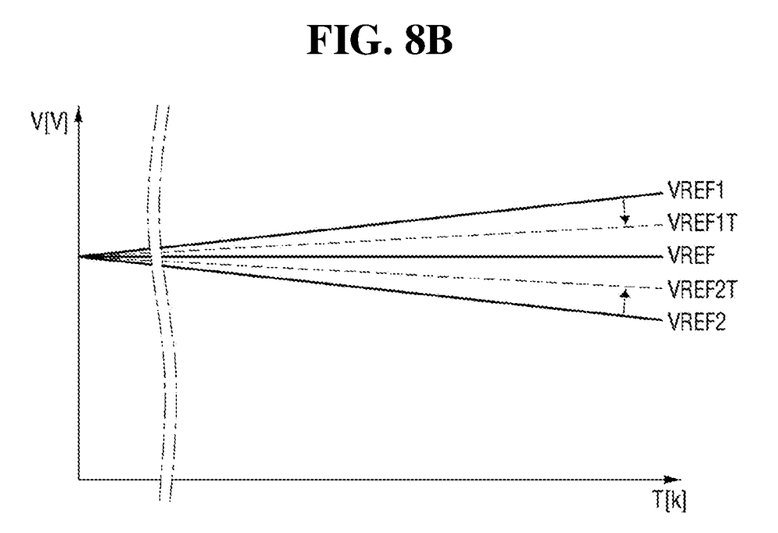

FIGS. 8A and 8B are graphs further illustrating a voltage correction performed by the CMOS temperature sensor according to embodiments of the inventive concept.

First, referring to FIG. 8A, three base-emitter voltages VBE, VBE1, and VBE2 having different shapes by variation are shown. Among these, the base-emitter voltage VBE corresponds to an ideal case, and the remaining VBE1 and VBE2 show a case where the base-emitter voltage VBE includes somewhat variation.

As shown in the drawing, the three base-emitter voltage graphs VBE, VBE1, and VBE2 converge into one voltage (1.25V) at an absolute temperature of 0K, and the variation increases as the absolute temperature rises.

Since the reference voltage VREF is generated using the base-emitter voltage VBE, in order to reduce the variation of the reference voltage VREF, a process of reducing the variation of the base-emitter voltage VBE is essential.

As the method of reducing the variation of the three base-emitter voltage graphs VBE, VBE1, and VBE2 shown in FIG. 8A, there is proposed a method of controlling the level of the current flowing in the second BJT.

As shown in FIG. 8A, the base-emitter voltage graphs VBE1 and VBE2 among the three base-emitter voltage graphs VBE, VBE1 and VBE2 are corrected.

Specifically, the base-emitter voltage VBE of the second BJT BJT2 may be corrected by the level of the current controlled to flow to the second BJT BJT2 by the first current source I1. For example, the first current source I1 may correct VBE1 into VBE1T by reducing the level of the current provided to the second BJT BJT2. Conversely, the first current source I1 may correct VBE2 into VBE2T by increasing the level of the current provided to the second BJT BJT2.

The level of the current output to the fourth node N4 by the above-described first current source I1 may be controlled by the operation of the first current source I1 having been described with reference to FIG. 6.

The corrected graphs VBE1T and VBE2T are adjusted to meet the ideal base-emitter voltage VBE at one point at temperature (an absolute temperature of 0K).

Further, in FIG. 8B, three reference voltages VREF, VREF1, and VREF2 having different shapes by variation are shown. Among these, the reference voltage VREF corresponds to an ideal case, the VREF1 is a reference voltage value when the base-emitter voltage is VBE1, and the the VREF2 is a reference voltage value when the base-emitter voltage is VBE2.

The reference voltage VREF is calculated by the following equation using the relationship between the base-emitter voltage VBE and the ΔVBE.

$$VREF = VBE + \Delta VBE/R1 \times R2$$

Therefore, the correction of the graph of the reference voltage VREF may also be performed through the correction of the base-emitter voltage VBE of the second BJT BJT2 described above with reference to FIG. 8A. That is, the graph of the reference voltages VREF1 and VREF2 having the variation may be corrected by controlling the level of the current provided to the second BJT BJT2 by the first current source I1.

Specifically, the first current source I1 may correct VREF1 into VREF1T by reducing the level of the current provided to the second BJT BJT2. Conversely, the first current source I1 may correct VREF2 into VREF2T by increasing the level of the current provided to the second BJT BJT2.

The corrected graphs VREF1T and VREF2T are adjusted to meet the ideal reference voltage VREF at one point at temperature (an absolute temperature of 0K).

Figure 9:
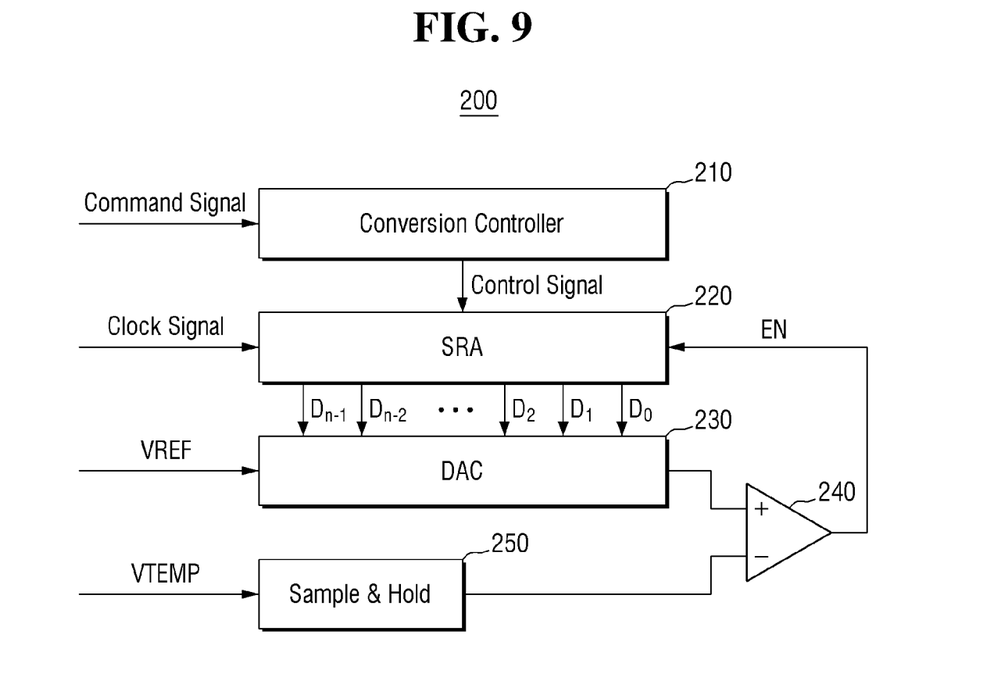
FIG. 9 is a block diagram further illustrating in one example the analog-to-digital converter (ADC) 200 of the temperature sensor of FIG. 1.

FIG. 9 is a block diagram further illustrating in one example the ADC 200 of FIG. 1. Referring to FIG. 9, the ADC 200 includes a conversion controller 210, a successive approximation register (SAR) 220, a digital-to-analog converter (DAC) 230, a comparator 240 and a sample and hold 250.

The conversion controller 210 receives an externally provided command signal that controls the start of the analog-to-digital conversion operation. That is, the conversion controller 210 may generate and provide a control signal to the SAR 220.

In response to the control signal from the conversion controller 210 and a received clock signal, the SAR 220 starts the analog-to-digital conversion operation. In certain embodiments, the SAR 220 provides N-bit count signals $D_0$ to $D_{n-1}$, which increase in accordance with a number of counted clock signals, to the DAC 230.

The DAC 230 receives the reference voltage VREF, as well as the N-bit count signals $D_0$ to $D_{n-1}$, and provides the N-bit count signals $D_0$ to $D_{n-1}$ to the comparator 240 in relation to the reference voltage VREF.

The comparator 240 receives as inputs both the temperature information voltage VTEMP provided by the temperature information voltage generator 130 via a Sample & Hold circuit 250 as well as the digital output signal of the DAC 230, and compares the temperature information voltage VTEMP with the digital output signal to generate an enable signal (EN) feedback to the SAR 220.

In this manner, the ADC 200 may use the temperature information voltage VTEMP and the reference voltage VREF in the process of converting the temperature information voltage VTEMP. However, if the level of the temperature information voltage VTEMP becomes equal to the level of the reference voltage VREF during the analog-to-digital conversion by the SAR ADC 200, the converted result value will be saturated to the highest value. If the level of the temperature information voltage VTEMP is higher than the level of the reference voltage VREF, all the temperature information included in the temperature information voltage VTEMP higher than the reference voltage VREF may disappear.

Therefore, CMOS temperature sensors according to embodiments of the inventive concept should control the second current source I2 to provide current of a predetermined level such that the temperature information voltage VTEMP does not exceed the level of the reference voltage VREF.

Figure 10:
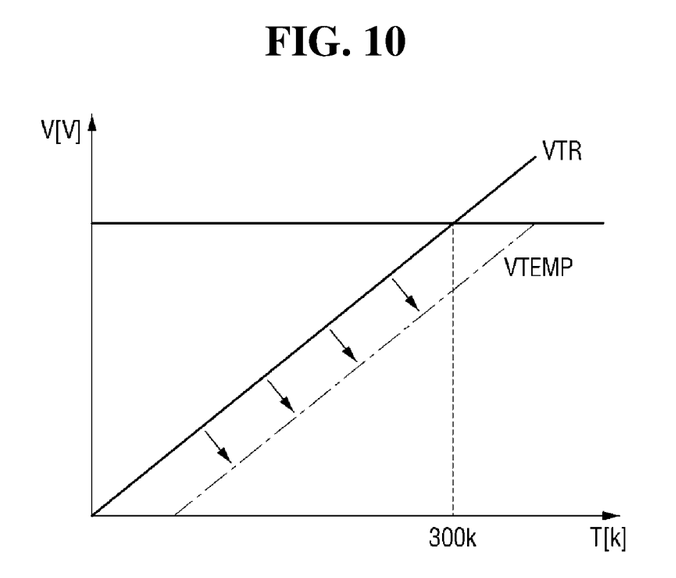
FIG. 10 is a graph for further illustrating operation of the ADC of FIG. 9.

FIG. 10 is a graph further illustrating in one example the operation of the ADC 200 of FIGS. 1 and 9. With reference to FIGS. 5 and 10, the second current source I2 is assumed to provide current I2 equal to VREF/R4. That is, the second current source I2 is configured to provide a current equal in level to the reference voltage VREF divided by the resistance value of the fourth resistor R4, where the fourth resistor may be (e.g.) a resistor having a variable resistance value.

As the second current source I2 is connected to the output terminal of the temperature information voltage VTEMP, the temperature information voltage VTEMP may be adjusted as follows.

$$VTEMP = (IPTAT - VREF/R4) \times R3$$
$$= (\Delta VBE/R1 - VREF/R4) \times R3$$

That is, the temperature information voltage generator 130 may include the second current source I2 that allows a part of the temperature-proportional current IPTAT flowing through the fourth PMOS transistor MP4 to flow. Thus, the temperature information voltage generator 130 can control the magnitude of the temperature information voltage VTEMP such that a voltage VTR higher than the reference voltage VREF is not higher than the reference voltage VREF.

Although it has been described with reference to FIGS. 9 and 10 that the CMOS temperature sensor according to embodiments of the inventive concept includes SAR ADC, this is illustrative, and the present inventive concepts is not limited thereto. The CMOS temperature sensor is sufficient if it includes an ADC capable of receiving the reference voltage VREF and the temperature information voltage VTEMP and converting the intensive information of the temperature information voltage VTEMP into digital information.

Although the preferred embodiments of the present inventive concepts have been disclosed for illustrative purposes, those skilled in the art will appreciate that various modifications, additions and substitutions are possible, without departing from the scope and spirit of the invention as disclosed in the accompanying claims.

What is claimed is:

1. A CMOS temperature sensor, comprising:
a bandgap reference circuit providing a bandgap reference voltage regardless of temperature using a first voltage inversely proportional to temperature and a second voltage proportional to temperature, and further providing a first current proportional to temperature using the second voltage;
a reference voltage generator copying the first current and providing a reference voltage generated using the first voltage and the copied first current; and
a temperature information voltage generator copying the first current and providing a temperature information voltage proportional to temperature,
wherein the temperature information voltage generator includes a current source controlling a level of the temperature information voltage in response to the reference voltage.

2. The CMOS temperature sensor of claim 1, wherein the bandgap reference circuit includes a first BJT and a second BJT having commonly connected base terminals, and
the first voltage is a base-emitter voltage of the first BJT, and the second voltage is a difference between the first voltage and a base-emitter voltage of the second BJT.

3. The CMOS temperature sensor of claim 2, wherein the bandgap reference circuit comprises a first resistor connected to the second BJT, and the first current is a current flowing through the first resistor in response to the second voltage.

4. The CMOS temperature sensor of claim 1, wherein the current source controls the level of the temperature information voltage, such that the level of the temperature information voltage is not higher than a level of the reference voltage.

5. The CMOS temperature sensor of claim 1, wherein the bandgap reference circuit includes a first transistor and a second transistor having gates commonly connected at a node and equally dividing the first current.

6. The CMOS temperature sensor of claim 5, wherein the reference voltage generator and the temperature information voltage generator respectively receive a voltage level at the node, and respectively copy the first current using the voltage level at the node.

7. The CMOS temperature sensor of claim 5, wherein the reference voltage generator further includes a current source receiving a voltage level at the node and providing the first current.

8. The CMOS temperature sensor of claim 7, wherein the current source includes at least one transistor having a size different from a size of the first transistor.

9. The CMOS temperature sensor of claim 1, further comprising:
an analog-digital converter (ADC) receiving the reference voltage and the temperature information voltage, and performing an analog-to-digital conversion of the temperature information voltage to provide a temperature information signal.

10. The CMOS temperature sensor of claim 1, wherein the reference voltage is generated using the first voltage, the copied first current and a first resistance of a first resistor in the reference voltage generator, and
the temperature information voltage is generated by using the copied first current, the reference voltage, a second resistance of a second resistor in the current source and a third resistance of a third resistor in the temperature information voltage generator.

11. A CMOS temperature sensor, comprising:
a bandgap reference circuit providing a bandgap reference voltage regardless of temperature in relation to a first voltage inversely proportional to temperature and a second voltage proportional to temperature;
a reference voltage generator providing a reference voltage generated by correcting the first voltage into the second voltage; and a temperature information voltage generator generating a temperature information voltage proportional to temperature on the basis of the second voltage.

12. The CMOS temperature sensor of claim 11, wherein the bandgap reference circuit includes a first BJT and a second BJT having commonly connected base terminals, and the first voltage is a base-emitter voltage of the first BJT, and the second voltage is a difference between the first voltage and a base-emitter voltage of the second BJT.

13. The CMOS temperature sensor of claim 11, wherein the temperature information voltage generator includes a current source controlling a level of the temperature information voltage in response to the reference voltage.

14. The CMOS temperature sensor of claim 13, wherein the current source controls the level of the temperature information voltage such that the level of the temperature information voltage is not higher than a level of the reference voltage.

15. The CMOS temperature sensor of claim 11, wherein the bandgap reference circuit includes a first transistor and a second transistor having gates commonly connected at a node.

16. The CMOS temperature sensor of claim 15, wherein the reference voltage generator and the temperature information voltage generator respectively receive a voltage level at the node in order to copy the first current.

17. The CMOS temperature sensor of claim 15, the reference voltage generator comprises a current source receiving a voltage level at the node and providing the first current.

18. The CMOS temperature sensor of claim 17, wherein the current source includes at least one transistor having size different from a size of the first transistor.

19. A CMOS temperature sensor, comprising:
a bandgap reference circuit including a first BJT and a second BJT whose base terminals are connected to each other, the bandgap reference circuit generating a temperature-proportional current using a first voltage, which is a base-emitter voltage of the first BJT, and a second voltage based on a difference between the first voltage and a base-emitter voltage of the second BJT;
a reference voltage generator generating a reference voltage on the basis of the temperature-proportional current and the first voltage; and
a temperature information voltage generator generating a temperature information voltage on the basis of the temperature-proportional current, and including a current source controlling a level of the temperature information voltage on the basis of the reference voltage.

20. The CMOS temperature sensor of claim 19, wherein the current source controls a level of the temperature information voltage, such that the level of the temperature information voltage is not higher than a level of the reference voltage.

* * * * *